United States Patent [19]
Sung et al.

[11] Patent Number: 5,802,540
[45] Date of Patent: Sep. 1, 1998

[54] PROGRAMMING AND VERIFICATION ADDRESS GENERATION FOR RANDOM ACCESS MEMORY BLOCKS IN PROGRAMMABLE LOGIC ARRAY INTEGRATED CIRCUIT DEVICES

[75] Inventors: Chiakang Sung, Milpitas; Joseph Huang, San Jose; Wanli Chang, Saratoga, all of Calif.

[73] Assignee: Altera Corporation, San Jose, Calif.

[21] Appl. No.: 555,283

[22] Filed: Nov. 8, 1995

[51] Int. Cl.$^6$ .................................................. G06F 12/02
[52] U.S. Cl. ............................ 711/1; 711/219; 326/39
[58] Field of Search .................. 326/39, 41; 365/189.08, 365/230.04, 236, 230.03; 395/405, 421.09; 711/5, 219, 1

[56] References Cited

U.S. PATENT DOCUMENTS

| | | | |
|---|---|---|---|
| 4,791,603 | 12/1988 | Henry | 326/38 |
| 5,128,559 | 7/1992 | Steele | 307/465 |
| 5,274,581 | 12/1993 | Cliff et al. | 364/784 |
| 5,469,400 | 11/1995 | Yamano | 365/230.01 |
| 5,550,782 | 8/1996 | Cliff et al. | 365/230.03 |

OTHER PUBLICATIONS

John L. Nichols, "A Logical Next Step for Read–Only Memories", Electronics, Jun. 12, 1967, pp. 111–113.
Floyd Kvamme, "Standard Read–Only Memories Simplify Complex Logic Design", Electronics, Jan. 5, 1970, pp. 88–95.
Albert Hemel, "Making Small ROM's [sic] Do Math Quickly, Cheaply and Easily", Electronics, May, 11, 1970, pp. 104–111.
William I. Fletcher et al., "Simplify Sequential Circuit Designs", Electronic Design, Jul. 8, 1971, pp. 70–72.
Howard A. Sholl et al., l"Design of Asynchronous Sequential Networkds Using Read–Only Memories", IEEE Transactions on Computers, vol. C–24, No. 2, Feb. 1975, pp. 195–206.
Aronld Weinberger, "High–Speed Programmable Logic Arrays Adders", IBM J. Res. Develop., vol. 23, No. 2, Mar. 1979, pp. 163–178.
Yahiko Kambayashi, "Logic Design of Programmable Logic Arrays", IEEE Transactions on Computers, vol. c–28, No. 9, Sep. 1979, pp. 609–617.

*Primary Examiner*—Eddie P. Chan
*Assistant Examiner*—Gary J. Portka
*Attorney, Agent, or Firm*—Fish & Neave; Robert R. Jackson

[57] ABSTRACT

A programmable logic array integrated circuit device has a relatively large block of programmable memory cells in addition to the usual programmable logic modules and the usual programmable interconnection conductor network. In order to simplify the circuitry associated with the large block, and especially the circuitry for addressing that block during programming and/or verification of the device, the address decoder that is normally used to address the block during use of the device to perform logic is also used during programming and/or verification. During programming and/or verification a counter or other similar coded address signal generating circuitry is used to supply address information to the decoder.

10 Claims, 3 Drawing Sheets

FIG.2

| | 60a | 60b | 60c | 60d | 60e | 60f | 60g | 60h | 60i | 60j |
|---|---|---|---|---|---|---|---|---|---|---|
| ⋮ | ⋮ | | ⋮ | ⋮ | ⋮ | ⋮ | | ⋮ | ⋮ | ⋮ |
| n−2 | 1 | | 1 | 1 | 1 | 1 | | 1 | 1 | 1 | 1 |
| n−1 | 1 | | 1 | 1 | 1 | 1 | | 1 | 1 | 1 | 0 |
| n | 1 | | 1 | 1 | 1 | 1 | | 1 | 1 | 0 | 0 |
| n+1 | 1 | | 1 | 1 | 1 | 1 | | 1 | 0 | 0 | 0 |
| n+2 | 1 | | 1 | 1 | 1 | 1 | | 0 | 0 | 0 | 0 |
| ⋮ | ⋮ | ... | ⋮ | ⋮ | ⋮ | ⋮ | ... | ⋮ | ⋮ | ⋮ | ⋮ ... |
| n+(m−1) | 1 | | 1 | 1 | 1 | 1 | 0 | | 0 | 0 | 0 | 0 |
| n+m | 1 | | 1 | 1 | 1 | 0 | 0 | | 0 | 0 | 0 | 0 |
| n+m+1 | 1 | | 1 | 1 | 0 | 0 | 0 | | 0 | 0 | 0 | 0 |
| n+m+2 | 1 | | 1 | 0 | 0 | 0 | 0 | | 0 | 0 | 0 | 0 |
| n+m+3 | 1 | | 0 | 0 | 0 | 0 | 0 | | 0 | 0 | 0 | 0 |
| ⋮ | | ⋮ | | ⋮ | ⋮ | ⋮ | ⋮ | | ⋮ | ⋮ | ⋮ |

1

PROGRAMMING AND VERIFICATION ADDRESS GENERATION FOR RANDOM ACCESS MEMORY BLOCKS IN PROGRAMMABLE LOGIC ARRAY INTEGRATED CIRCUIT DEVICES

BACKGROUND OF THE INVENTION

This invention relates to programmable logic array integrated circuit devices, and more particularly to such devices of the type that have blocks of random access memory ("RAM") that may require programming for use as read-only memory ("ROM").

U.S. Pat. No. 5,689,195 and Cliff et al. U.S. Pat. No. 5,550,782, show programmable logic array integrated circuit devices ("RAM") in addition to the usual large number of relatively small programmable logic modules and the usual programmable network of interconnection conductors. (These two prior patent applications are hereby incorporated by reference herein.) During programming of the other logic on the device, these large RAM blocks may be programmed as read-only memory ("ROM") for use in performing logic functions that may be more efficiently performed in a single relatively large memory block rather than in several relatively small logic modules. Alternatively, these RAM blocks may be used to store data, either in advance of use of the device to perform logic or during use of the device to perform logic.

The typical programmable logic device of the type described above also has a large number of other memory cells that must be programmed before the device can be used to perform logic. For example, these other memory cells determine the logic functions performed by the logic modules on the device, the interconnections that are made throughout the interconnection conductor network, etc. These other memory cells may be arranged in several first-in-first-out ("FIFO") chains for such purposes as programming the individual memory cells and subsequently reading out the contents of those cells in order to verify that they are programming properly. It would be desirable to be able to include the above-mentioned relatively large RAM blocks in such FIFO chains for programming and/or verification. However, this is not easily done because these RAM blocks are not readily addressable by the same logic that is used to address the other memory cells during programming and/or verification.

In view of the foregoing, it is an object of this invention to improve and simplify the circuitry needed to provide and make use of relatively large RAM blocks on programmable logic array integrated circuit devices.

It is a more particular object of this invention to provide improved and simplified circuitry for addressing relatively large RAM blocks on programmable logic array integrated circuit devices during programming and/or verification of those devices.

SUMMARY OF THE INVENTION

These and other objects of the invention are accomplished in accordance with the principles of the invention by providing a counter for use in addressing a relatively large RAM block on a programmable logic array integrated circuit device during programming and/or verification of the device. Each column in the RAM block is included in a FIFO chain of other memory cells on the device. When, during the row by row programming and/or verification of the memory on the device, addressing of the memory cell rows reaches the RAM block, the counter is enabled to count further address clock pulses. The outputs of the counter are applied to the normal row address decoder of the RAM block, which therefore selects one RAM block row after another for programming or verification during subsequent address clock pulses. The counter is stopped when all rows in the RAM block have been programmed.

Further features of the invention, its nature and various advantages will be more apparent from the accompanying drawings and the following detailed description of the preferred embodiments.

BRIEF DESCRIPTION OF THE DRAWINGS

FIG. 2 is a table showing illustrative outputs of a component shown in FIG. 1 at various times during operation of the FIG. 1 circuitry.

DETAILED DESCRIPTION OF THE PREFERRED EMBODIMENTS

The invention will be illustrated in the context of its application to a programmable logic array integrated circuit device of the general type shown in above-mentioned Cliff et al. U.S. Pat. No. 5,689,195. It will be understood, however, that this is only an exemplary embodiment of the invention, and that the invention is equally applicable in many other programmable logic device arrangements.

Figure 1:
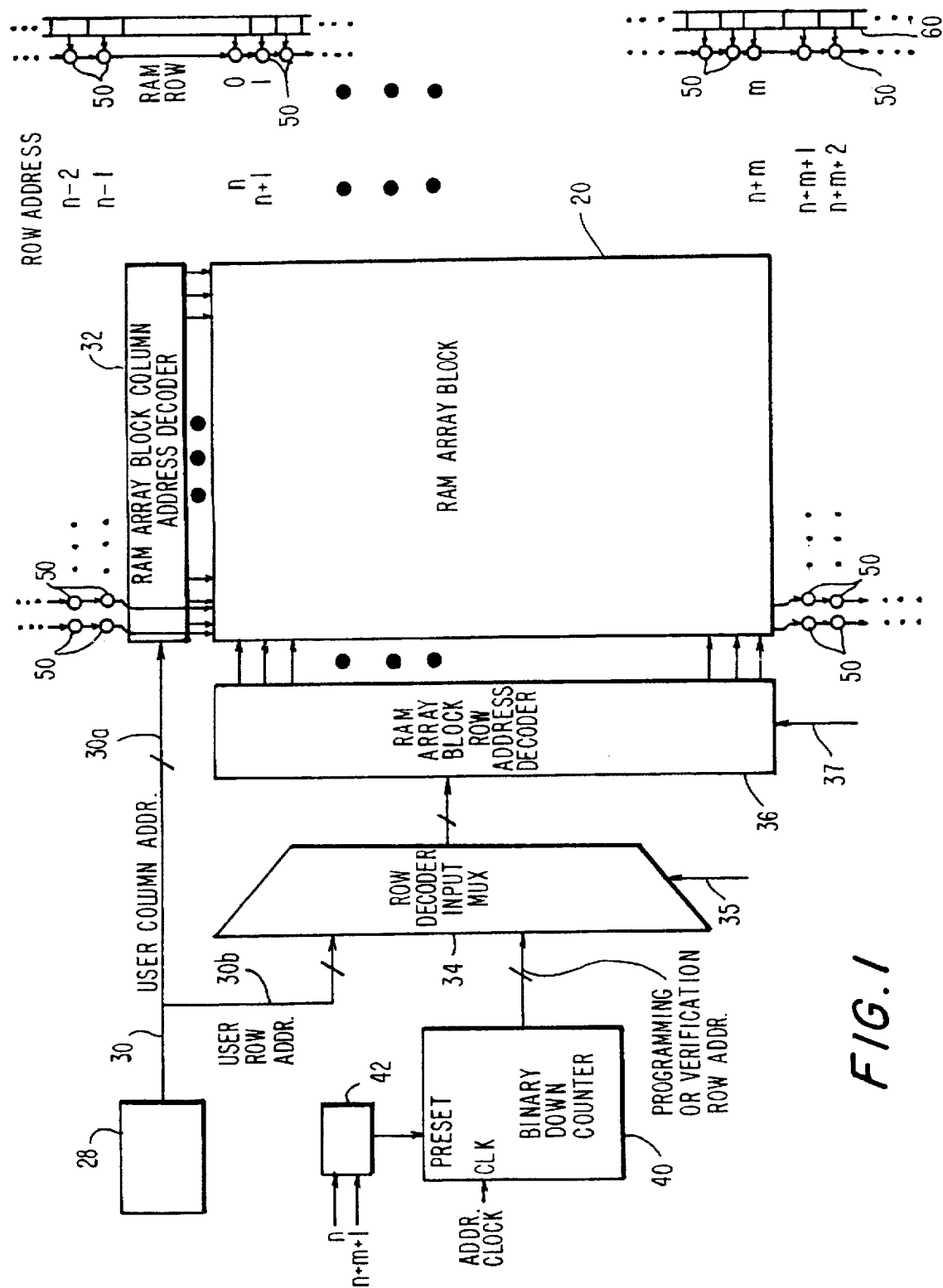
FIG. 1 is a simplified block diagram of a representative portion of an illustrative embodiment of circuitry constructed in accordance with this invention.

As shown in FIG. 1 a representative relatively large RAM block 20 on a programmable logic array device has m+1 rows and several columns of programmable memory cells. The rows are numbered 0 through m. For example, m may be 63, so that RAM block 20 has 64 rows. A typical number of columns in block 20 may be 32.

After the FIG. 1 device has been programmed and while it is in use to perform logic, the cells in block 20 are addressable by so-called user address information supplied via bus 30 (e.g., from programmable logic 28 on the device). This address information may be encoded using the binary number system, for example. In that case, 11 address bits are required to select one memory location from 64×32=2048 memory locations in RAM block 20.

Column address information on bus 30 is split off via sub-bus 30a and applied to column address decoder 32. Decoder 32 decodes the address information applied to it and selects the RAM block column identified by that information. (The usual column decoder selects only one column, but as described in Cliff et al. U.S. Pat. No. 5,689,195, the decoder apparatus may be constructed so that it can optionally select more than one column, thereby allowing data to be read out of or written into RAM block 20 in parallel to some degree. This is not pertinent to the present invention, however, so it will generally be assumed herein that decoder 32 selects only one column in RAM block 20 at any given time.)

Row address information on bus 30 is split off via sub-bus 30b and applied to row address decoder 36 via switching circuits or multiplexers 34. When the device is in logic mode (as opposed to programming or verification mode), multiplexers 34 are controlled to connect sub-bus 30b (rather than the outputs of counter 40) to decoder 36. Thus input 35 to multiplexers 34 is a control signal indicating whether the device is in logic mode or programming/verification mode. Decoder 36 decodes the address information applied to it and selects the RAM block row identified by that information.

Data may be written into or read from the RAM block 20 cell at the intersection of the row and column selections of decoders 32 and 36. In order to either read or write data, row address decoder 36 may in fact need to have two sets of row selection output signals, one for selecting a row to be written to, and another for selecting a row to be read from. Thus input 37 to decoder 36 may be a control signal for indicating whether reading or writing is desired. (Additional information about a possible implementation of RAM block 20 will be found in U.S. Pat. No. 5,633,830, which is also hereby incorporated by reference herein. However, it is not believed that this additional information is essential for understanding or practicing the present invention.)

For purposes of programming and/or verification—generally prior to use of the device to perform logic as described in the immediately preceding paragraphs—each column of RAM block 20 is connected in a serial FIFO chain of other programmable memory cells 50. As mentioned in the Background section of this specification, these other memory cells 50 typically control such other aspects of the device as the logic functions performed by the logic modules and the connections that are made in the interconnection conductor network on the device. In addition to the memory cell columns that include RAM block 20 columns, there are typically many other parallel columns of memory cells 50 on the device that do not include any cells of RAM block 20. One such other column of memory cells 50 is shown toward the right in FIG. 1. In each of these other columns the vertical space occupied by the m+1 rows of RAM block 20 in the columns that pass through RAM block 20 is typically occupied by m+1 ordinary memory cells 50.

During programming of the device, data to be stored in each column that includes memory cells 50 is applied to the top of that column. This data flows down through that column from memory cell to memory cell until it is stopped by an output signal from program/verify address register 60. Register 60 maybe a shift register which has one stage for each row of memory cells 50. The contents of register 60 may initially allow data to flow all the way down through all rows of cells 50 to allow verification that all columns are passing data properly. Thereafter, the contents of register 60 begin to cut off one row of cells 50 after another, working up from the bottom of the device, in response to successive pulses of an address clock signal (which is also one of the inputs to counter 40). Different programming data is applied to the tops of the columns of cells 50 during these successive address clock pulses. In this way the programming data applied during successive clock pulses is stored in successive rows of memory cells 50, working up from the bottom of the device.

Output signals of representative stages of register 60 during representative address clock signal pulses are shown in FIG. 2. Each row in FIG. 2 corresponds to a respective one of the stages of register 60. Each column in FIG. 2 corresponds to an address clock signal pulse. The convention assumed in FIG. 2 is that a "1" output from a stage of register 60 connects each memory cell 50 in the row associated with that stage to the memory cell 50 above. A "0" output from a register stage disconnects the associated memory cells from the cells above. In the expressions used in FIG. 2 n is the number of the first row in RAM block 20 in the overall FIFO chains that include columns in block 20. Thus FIFO row n is RAM block row 0, and FIFO row n+m is RAM block row m.

In the first column 60a in FIG. 2 the output signals of all stages of register 60 are 1. This connects all the memory cells 50 in each column to one another and allows data to flow all the way down through each FIFO chain. During successive address clock signal pulses, 0 outputs progressively and cumulatively begin to replace the original 1 outputs one register 60 stage at a time, working up from the bottom of that register. Thus in column 60b the output of the register 60 stage associated with memory cell row n+m+3 becomes 0, in column 60c the output of the register 60 stage associated with memory cell row n+m+2 also becomes 0, in column 60d the output of the register 60 stage associated with memory cell row n+m+1 also becomes 0, and so on. During the address clock pulse associated with column 60b, memory cell row n+m+2 receives the programming data flowing down through the FIFO chains from above. This data is fixed or stored in memory cell row n+m+2 once that row is cut off from the row above during the address clock pulse associated with column 60c.

Operation of the device to verify that its memory cells are properly storing programming data is very similar to what has been described above for programming the device, except that the 1s and 0s in FIG. 2 are all reversed. Thus all of the outputs of register 60 are initially 0, and during successive address clock pulses these 0s are progressively and cumulatively changed to 1s, working up from the bottom of the register. This allows the data stored in each successive row of memory cells to flow down through the rows below during successive address clock pulses so that the contents of all rows can be verified one after another. Of course, it will generally be necessary to reprogram the device after verification.

From the foregoing it will be apparent that the output signals of register 60 are very different from those that are required to select an individual row in RAM block 20, while at the same time deselecting all other rows in that block. In order to use the outputs of register 60 to select individual rows in RAM block 20 during programming and/or verification, elaborate re-coding of the register 60 outputs associated with the RAM block rows would be needed. This complexity is avoided by the present invention as will now be described.

The present invention avoids the need to address the rows of RAM block 20 directly from register 60 during programming and/or verification of the device. Instead, during these operations, the RAM block rows are addressed through the row address decoder 36 that is used during operation of the device to perform logic. During programming and/or verification, multiplexers 34 are controlled (via mode control signal 35) to apply the outputs of counter 40 (rather than the signals on sub-bus 30b) to decoder 36. Counter 40 is a binary down counter which is preset (by an output signal from trigger logic circuit 42) to the value m, and which thereafter counts down to 0 in response to successive address clock pulses. Counter 40 therefore produces binary output signals (exactly like those that row decoder 36 normally receives from sub-bus 30b) for causing decoder 36 to select the rows of RAM block 20 one after another from the bottom up. (When not counting down, counter 40 outputs all binary ones.)

Figure 3:
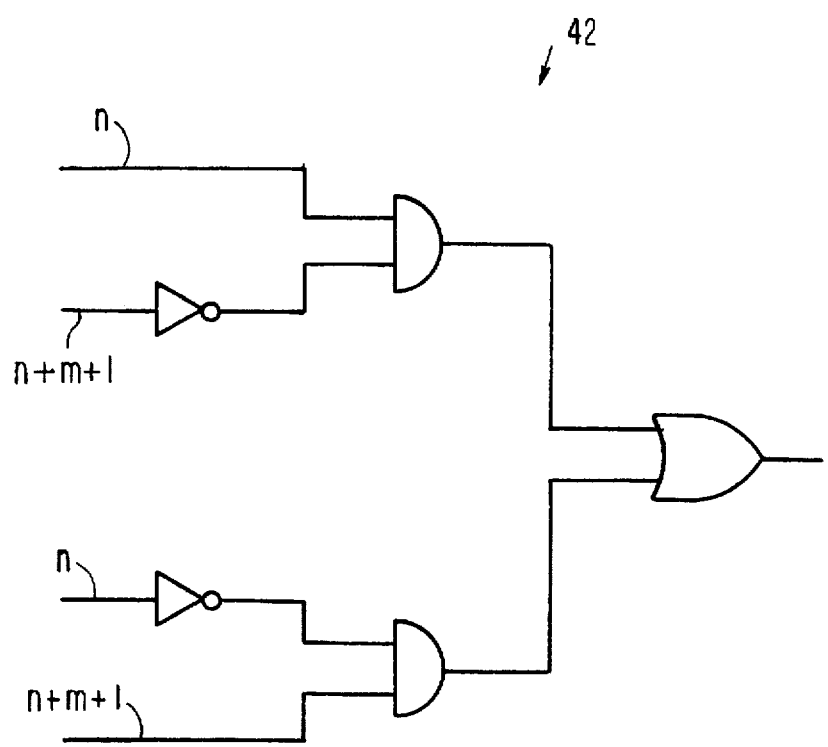
FIG. 3 is a schematic diagram of an illustrative embodiment of a portion of FIG. 1 in accordance with this invention.

Trigger logic circuit 42 applies a preset output signal to counter 40 under either of two conditions: (1) when the output signal of the register 60 stage associated with memory cell row n+m+1 is a signal for cutting off that row from the memory cell rows above that row, and the output signal of the register 60 stage associated with memory cell row n is a signal for not cutting off that row from the memory cell rows above that row, and (2) when the output signal of register 60 associated with row n+m+1 is a signal for connecting that row to the rows above that row, and the output signal of register 60 associated with row n is a signal for cutting off that row from the rows above that row. (An illustrative implementation of logic circuit 42 is shown in FIG. 3 for the register 60 output signal convention shown in FIG. 2.) Condition (1) above corresponds to being ready to begin programming RAM block 20. Condition (2) above corresponds to being ready to begin verifying the contents of RAM block 20. (If it is not desired to provide verification capability, the portion of logic circuit 42 for implementing condition (2) can be omitted.)

From the foregoing it will be seen that when programming of the device has proceeded to the point that all rows of memory cells 50 below RAM block 20 have been programmed and therefore cut off, and the next row to be programmed includes the bottom row m of block 20, counter 40 is preset to a value (i.e., m) that selects the bottom row of block 20. Thus the next applied programming data is stored in the bottom row of RAM block 20. (Outside of RAM block 20 programming of other memory cells 50 continues concurrently and as described above under direct control of register 60.) Thereafter, during successive address clock signal pulses, counter 40 counts down so that the rows of RAM block 20 are selected and programmed one after another, working from the bottom up. When the top-most row of RAM block 20 has been programmed, counter 40 (which has now counted down to 0) stops counting, and programming of the other memory cells 50 in rows above block 20 continues under direct control of register 60.

Turning now to verification, when all rows below RAM block 20 have been read out and the next row to be verified includes the bottom-most row m of RAM block 20, the output signal of logic circuit 42 presets counter 40 to m. This causes row address decoder 36 to select the bottom-most row of RAM block 20 for reading out, thereby allowing verification of that RAM block row. Thereafter, counter 40 counts down in response to successive address clock signal pulses, so that the contents of successive RAM block rows are read out (for verification) one after another, working from the bottom of the RAM block to the top. (Outside of RAM block 20 verification of other memory cells 50 continues concurrently under direct control of register 60.) When the top-most row of RAM block 20 has been selected and read out, counter 40 will have counted down to 0 and will therefore stop counting. Selection of rows of memory cells 50 above RAM block 20 then continues under direct control of register 60.

As the foregoing makes clear, this invention simplifies the circuitry that would otherwise be needed to address the cells of RAM block 20 during programming and/or verification. This simplification is due in large part to making use of the normal row address decoder (element 36) during programming and/or verification, as well as during normal operation of the device to perform logic.

It will be understood that the foregoing is only illustrative of the principles of this invention, and that various modification can be made by those skilled in the art without departing from the scope and spirit of the invention. For example, the specific size of RAM block 20 mentioned above is only illustrative, and RAM block 20 can have any other desired size. It will also be understood that words like "row" and "column", "up" and "down", etc., are used arbitrarily herein, and that they can be interchanged in relation to other embodiments of the invention. In other words, the invention is not limited in any way to any particular orientation of the circuitry on the device. In order to be somewhat more general in this regard, the word "slice" may be used to refer to either a row or a column of memory. As another example of modifications within the scope of the invention, the address coding used on sub-bus 30b can be something other than binary coding. In that event, counter 40 can be replaced by whatever code generating logic circuitry is required to automatically generate successive row address signals, in the code that decoder 36 normally receives from sub-bus 30b, in response to successive address clock pulses.

The invention claimed is:

1. A programmable logic array integrated circuit device comprising:

a plurality of memory slices;

a decoder for decoding address information applied to said decoder in order to select one of said memory slices which is identified in a predetermined code by said address information;

programmable logic for selectively applying said address information to said decoder;

a code generator circuit for selectively generating alternative address information which successively identifies each of said slices in said predetermined code;

switching circuitry for selectively applying said alternative address information to said decoder in lieu of said address information;

a plurality of additional memory slices which are not selectable by said decoder, said memory slices and said additional memory slices being in an ordered sequence in which all of said memory slices are adjacent to one another in a group that is preceded by a first subplurality of said additional memory slices and followed by a second subplurality of said additional memory slices; and a register circuit having a plurality of outputs, each of which is associated with a respective one of said memory slices and said additional memory slices, said outputs being initially in a first state, and progressively and cumulatively changing to a second state in a sequence which corresponds to the sequence of the associated slices, the state of each output of said register circuit that is associated with an additional memory slice having a predetermined effect on operation of that additional memory slice.

2. The device defined in claim 1 further comprising:

trigger circuitry, responsive to a first of said outputs that is associated with one of said memory slices changing to said second state, for then initiating operation of said code generator circuit to generate said alternative address information.

3. The device defined in claim 2 further comprising:

synchronizing circuitry for synchronizing operation of said register circuit and said code generator circuit so that said code generator circuit generates said alternative address information for identifying each successive one of said memory slices in synchronism with successive ones of said outputs changing state.

4. The device defined in claim 3 wherein said code generator circuit completes generating said alternative address information for successively identifying each of said memory slices concurrently with a last of said outputs that is associated with one of said memory slices changing to said second state.

5. The device defined in claim 1 wherein in said first state each of said outputs that is associated with one of said additional memory slices connects the associated additional memory slice to the preceding additional memory slice in said sequence for transmission of data from said preceding additional memory slice to said associated additional memory slice, and wherein in said second state said output disconnects said associated additional memory slice from said preceding additional memory slice.

6. The device defined in claim 5 wherein said data includes data for programming said additional memory slices, and wherein each of said additional memory slices stores and is thereby programmed with the data that it received from the preceding additional memory slice in said sequence immediately prior to being disconnected from said preceding additional memory slice by one of said outputs.

7. The device defined in claim 6 wherein said data additionally includes data for programming said memory slices, and wherein each of said memory slices stores and is thereby programmed with data that is being transmitted through said first subplurality of said additional memory slices when that memory slice is selected by said decoder.

8. The device defined in claim 1 wherein in said second state each of said outputs that is associated with one of said additional memory slices connects the associated additional memory slice to the preceding additional memory slice in said sequence for transmission of data from said preceding additional memory slice to said associated additional memory slice, and wherein in said first state said output disconnects said associated additional memory slice from said preceding additional memory slice.

9. The device defined in claim 8 wherein said data is transmitted between connected ones of said additional memory slices in order to verify correctness of the data stored in the first of said additional memory slices in said sequence that is among said connected ones of said additional memory slices.

10. The device defined in claim 9 wherein when all of said additional memory slices in said second plurality of said additional memory slices are connected for transmission of data, selection of one of said memory slices by said decoder causes data stored in that memory slice to be transmitted through said second subplurality of said memory slices in order to verify correctness of the data stored in the selected memory slice.

* * * * *